(12) United States Patent
Morohashi et al.

(10) Patent No.: US 9,280,068 B2
(45) Date of Patent: Mar. 8, 2016

(54) STAGE APPARATUS WITH FLEXIBLE UTILITY LINE, LITHOGRAPHY APPARATUS, AND ARTICLE MANUFACTURING METHOD

(71) Applicant: CANON KABUSHIKI KAISHA, Tokyo (JP)

(72) Inventors: Akira Morohashi, Utsunomiya (JP); Tadashi Kimura, Chikusei (JP); Nobushige Korenaga, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 191 days.

(21) Appl. No.: 14/066,810

(22) Filed: Oct. 30, 2013

(65) Prior Publication Data
US 2014/0118710 A1 May 1, 2014

(30) Foreign Application Priority Data
Oct. 30, 2012 (JP) .................................. 2012-239116

(51) Int. Cl.
*G03F 7/20* (2006.01)
(52) U.S. Cl.
CPC ........ *G03F 7/70808* (2013.01); *G03F 7/70716* (2013.01)

(58) Field of Classification Search
CPC ..... G03F 7/70808; G03F 7/708; G03F 7/709; G03F 7/70358; G03F 7/70716
USPC ............................................................ 355/72
See application file for complete search history.

(56) References Cited

U.S. PATENT DOCUMENTS

| | | | | |
|---|---|---|---|---|
| 6,134,981 A | * | 10/2000 | Novak et al. | 74/490.09 |
| 8,102,500 B2 | | 1/2012 | Sato et al. | |
| 2007/0273861 A1 | * | 11/2007 | Sato et al. | 355/72 |

FOREIGN PATENT DOCUMENTS

JP 2008004918 A 1/2008

* cited by examiner

*Primary Examiner* — Peter B Kim
*Assistant Examiner* — Michelle Iacoletti
(74) *Attorney, Agent, or Firm* — Rossi, Kimms & McDowell LLP

(57) ABSTRACT

A stage apparatus has a base; a movable portion including a stage movable relative to the base; a flexible utility line for supplying utility to the movable portion; and a cover for covering the utility line, the cover including: a housing member provided to one of the base and the movable portion, in which an opening is formed; and a sealing member provided to the other of the base and the movable portion, which is arranged opposite to a side, in which the opening is formed, of the housing member with a gap therebetween, and has a side for sealing the opening.

10 Claims, 2 Drawing Sheets

STAGE APPARATUS WITH FLEXIBLE UTILITY LINE, LITHOGRAPHY APPARATUS, AND ARTICLE MANUFACTURING METHOD

BACKGROUND OF THE INVENTION

1. Field of the Invention

The present invention relates to a stage apparatus, a lithography apparatus, and an article manufacturing method.

2. Description of the Related Art

A stage apparatus, which has a movable portion and a fixed portion, moves with a workpiece mounted thereon. In order to supply utility to a unit located on the side of the movable portion, the movable portion and the fixed portion are connected by wires and pipes. The wires and pipes between the movable portion and the fixed portion are made of flexible material and thus can bend and deform according to the movement of the stage. The bending and deforming of the wires and/or pipes during the movement of the stage apparatus can cause particles (also referred to as dust).

In general, in order to prevent the diffusion of particles, a dust generating source is covered with a cover. Japanese Patent Laid-Open No. 2008-004918 discloses a method that includes covering a bundle of wires and pipes with a surrounding member having a bellows structure or the like with an excellent flexibility, and evacuating the inside of the surrounding member.

Covering the wires and pipes with a flexible cover, however, do not lead to the fundamental solution because the cover itself generates dust due to its bending and deforming.

There is also a method that includes arranging a hard cover that does not deform for covering the whole movable range of wires and pipes on the side of the fixed portion of a stage, thereby preventing the diffusion of particles generated from the wires and pipes to the surrounding environment without generating particles from the cover itself. This arrangement, however, requires a slit opening having a length of a stage stroke and a width of the thickness of the wires and pipes on a side of the cover in order to take out the wires and/or pipes connected to the side of the movable portion, resulting in a remarkably deteriorated sealing property of the cover.

SUMMARY OF THE INVENTION

The present invention provides, for example, a stage apparatus advantageous to reduction of diffusion of dust to surrounding.

The present invention provides a stage apparatus having: a base; a movable portion including a stage movable relative to the base; a flexible utility line for supplying utility to the movable portion; and a cover for covering the utility line, the cover including: a housing member provided to one of the base and the movable portion, in which an opening is formed; and a sealing member provided to the other of the base and the movable portion, which is arranged opposite to a side, in which the opening is formed, of the housing member with a gap therebetween, and has a side for sealing the opening.

Further features of the present invention will become apparent from the following description of exemplary embodiments with reference to the attached drawings.

DESCRIPTION OF THE EMBODIMENTS

Hereinafter, preferred embodiments of the present invention will be described with reference to the attached drawings.

Figure 1:
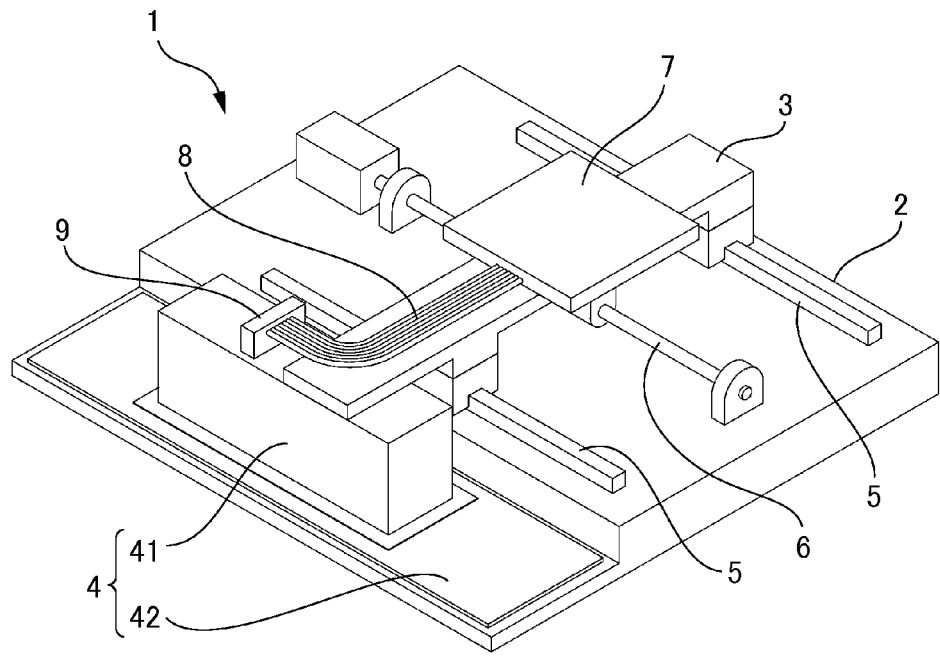
FIG. 1 is a diagram illustrating the configuration of a stage apparatus according to one embodiment of the present invention.

FIG. 1 is a schematic diagram of a stage apparatus 1 according to one embodiment of the present invention. The stage apparatus 1 according to one embodiment of the present invention includes a stage base (fixed portion or base) 2, a movable stage (a member or portion that can move with the movable stage is also referred to as a movable portion) 3, and a particle cover (a cover) 4. Note that, in one embodiment of the present invention, the stage apparatus is applied to a lithography apparatus.

On the stage base 2, a linear guide device 5 and a feed screw device 6 are arranged in parallel, and the movable stage 3 is mounted on movable bodies thereof. The movable stage 3 is moved in the guiding direction of the linear guide device 5 by the drive of the feed screw device 6. A top plate 7 having any function (for example, mounting a workpiece thereon) is fixed to the movable stage 3, and movable stage pipes 8 for supplying utility are connected to the top plate 7. Note that the pipes may be wires, and they are also collectively referred to as "utility lines". The one end of the movable stage pipes 8 is connected to a movable-side external manifold 9 fixed on the outside of a box-shaped cover (first cover or housing member) 41 of the particle cover 4 as will be described later.

The particle cover 4 includes the box-shaped cover 41 mounted on (supported by) the movable stage 3 and a plate-shaped cover (second cover or sealing member) 42 mounted on the stage base 2, and has the function of preventing or reducing the diffusion of particles. The bottom of the box-shaped cover 41 is opposed to the plate-shaped cover 42 without contact therewith and in parallel thereto with a fine gap therebetween, and a part or whole of the bottom is open. Note that all sides except one having the bottom opening of the box-shaped cover 41 are closed. The bottom having the opening of the box-shaped cover 41 and the top of the plate-shaped cover 42 are configured to be in parallel to the moving direction of the movable stage 3, and therefore the change in the fine gap due to the movement of the movable stage 3 is extremely small. The periphery of the bottom of the box-shaped cover 41 includes a flange-like rim, thereby enhancing the sealing between the box-shaped cover 41 and the plate-shaped cover 42. In this way, the particle cover 4 composed of the box-shaped cover 41 and the plate-shaped cover 42 realizes a structure to seal the inside thereof by sealing the fine gap. Note that various seal mechanisms such as a labyrinth seal, differential pumping seal, or ferrofluidic seal may be added to the flange-like rim.

Figure 2:
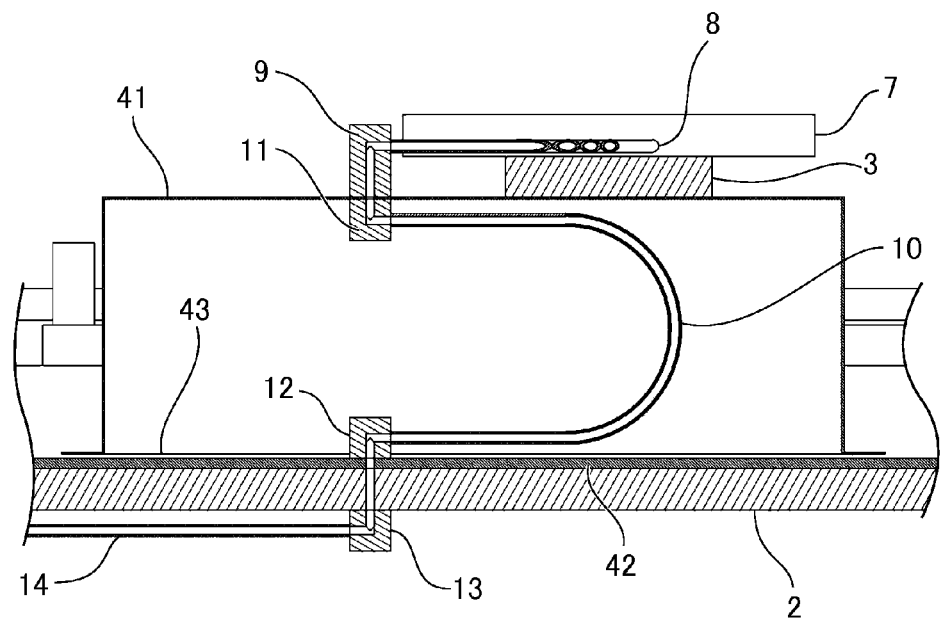
FIG. 2 is a cross-sectional view illustrating the configuration of pipes and a cover according to one embodiment of the present invention.

FIG. 2 is a cross-sectional view of the essential parts of the stage apparatus 1. The moving direction of the movable stage 3 is in the right and left directions on the drawing. In the space surrounded by the particle cover 4, flexible pipes 10 are arranged with its axial direction in parallel to the moving direction of the movable stage 3, and folded into U-shaped form midway. The end of the flexible pipes 10 on the side of the movable stage 3 is connected to a movable-side manifold 11 inside the particle cover 4. The flexible pipes 10 are connected via the movable-side manifold 11 and the movable-side external manifold 9 to the movable stage pipes 8. The movable-side manifold 11, the box-shaped cover 41, the movable-side external manifold 9, and the movable stage pipes 8 are fixed to the movable stage 3, and move integrally. Consequently, a slit opening (opening having a length of a stage stroke and a width of the thickness of the pipes) required on the side of a movable portion in a conventional cover structure in order to take out pipes is no longer necessary, whereby the sealing property of the particle cover 4 can be enhanced.

The end of the flexible pipes 10 on the side of the stage base 2 is connected to a fixed-side manifold 12 inside the particle cover 4. The flexible pipes 10 are connected via the fixed-side manifold 12, the through-hole of the plate-shaped cover 42, the through-hole of the stage base 2, and a fixed-side external manifold 13 to fixed stage pipes 14 outside the particle cover 4. The fixed stage pipes 14 are connected to an external device (not shown). The fixed-side manifold 12, the plate-shaped cover 42, the fixed-side external manifold 13, and the fixed stage pipes 14 are mounted on the stage base 2, and do not move. Note that since the movable stage pipes 8 and the fixed stage pipes 14 neither bend nor deform (they do not have to be made of flexible material), a cover is not required in consideration of dust generation.

Figure 3:
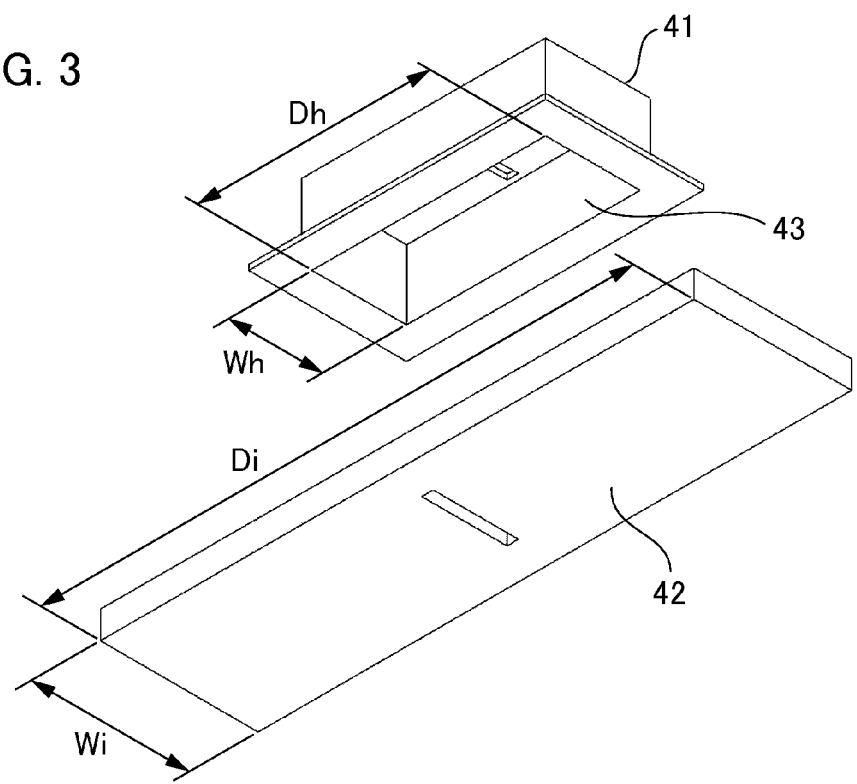
FIG. 3 is a perspective view of the configuration of a cover according to one embodiment of the present invention, seen from the side having an opening.

FIG. 3 is a perspective view of the particle cover 4 seen obliquely from the lower side of the plate-shaped cover 42. The area of the side of the plate-shaped cover 42 opposite to the opening 43 of the box-shaped cover 41 is larger than that of the opening 43. Here, the particle cover 4 is configured to be Di>Dh and Wi>Wh, and the plate-shaped cover 42 is configured to seal the opening 43. In addition, the stage apparatus 1 is configured such that the opening 43 of the box-shaped cover 41 is sealed by the plate-shaped cover 42 within the movable range of the movable stage 3, that is, Di>Dh+[a length of a moving stroke of the movable stage 3].

The movable-side manifold 11 moves along with the movement of the movable stage 3, while the fixed-side manifold 12 does not move. When the flexible pipes 10 move, the folded position, i.e. bending portion moves while the U-shaped folded form is maintained. The box-shaped cover 41 is sized so as not to contact with the flexible pipes 10 and the fixed-side manifold 12 within the movable range. On the other hand, the plate-shaped cover 42 is sized to cover the bottom (the flange-like rim) of the box-shaped cover 41 within the movable range of the box-shaped cover 41 all the time. Therefore, within the moving range of the movable stage 3, the sealing property (tight-sealing property) of the particle cover 4 is retained. Note that the plate-shaped cover 42 may be integral with the stage base 2.

As one example, the stage apparatus 1, which has the flexible pipes 10 that connects the fixed portion (stationary portion) and the movable portion, according to one embodiment of the present invention has been described above. The pipes, however, are not limited thereto, and they may be wires that connect the fixed portion and the movable portion, or pipes and wires may coexist. In the case of wires, a terminal block (connector) may be used in place of the manifold. Here, the manifold and the terminal block each are also referred to as a "connector". In addition, the similar effect can be obtained by providing the box-shaped cover 41 on the side of the stage base 2 (one side) and the plate-shaped cover 42 on the side of the movable stage 3 (the other side).

(Embodiments of the Lithography Apparatus)

Figure 4:
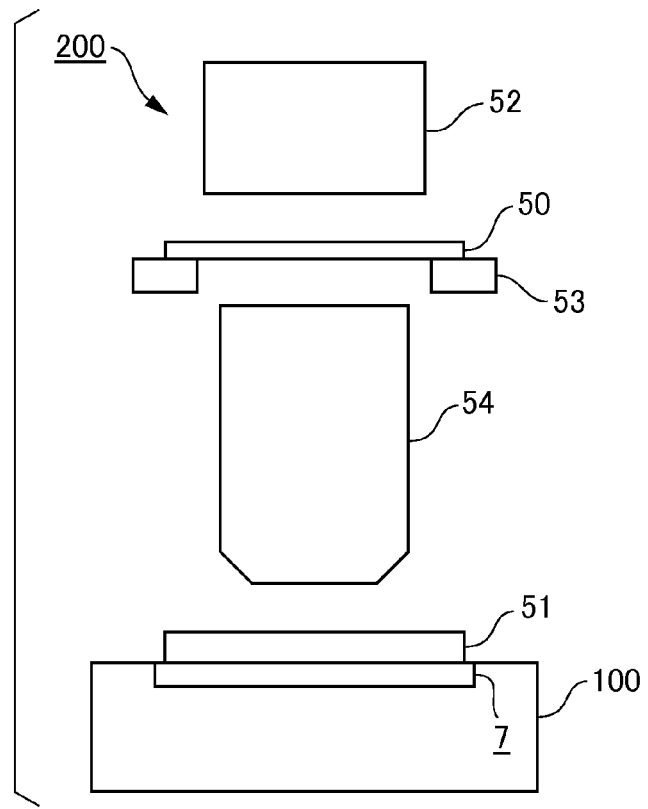
FIG. 4 is a drawing that shows an exposure apparatus according to one embodiment of the present invention.

An exposure apparatus 200, one example of a lithography apparatus according to an embodiment of the present invention, will be described with reference to FIG. 4. FIG. 4 is a schematic diagram that shows the configuration of the exposure apparatus 200 according to the present invention. The exposure apparatus 200 according to the present invention is configured to expose a substrate by projecting a pattern of a mask (original) 50 onto a substrate (for example, glass substrate or semiconductor substrate) 51. The exposure apparatus 200 includes an illumination optical system 52, a mask stage 53, a substrate stage 7, a projection optical system 54 for projecting the pattern of the mask 50 onto the substrate 51, and a stage apparatus 100 including the substrate stage 7. The illumination optical system 52 illuminates the mask 50 with ultraviolet light, vacuum ultraviolet light, or extreme ultraviolet light, the mask stage 53 holds the mask 50, and the substrate stage 7 includes a holder (chuck) for holding the substrate 51.

In the exposure apparatus 200 thus configured, the stage apparatus 100 including the substrate stage 7 is configured as the above described stage apparatus 1. Therefore, the diffusion of particles from at least one of wires and pipes for supplying utility to the movable portion (substrate stage 7) to the surrounding environment is reduced. Consequently, the adhesion of particles to the substrate, the mask, or a component of the exposure apparatus can be reduced, whereby defects in manufactured articles and decreases in yield can be suppressed or reduced. In other words, the exposure apparatus 200 is advantageous for microfabrication.

As one example of a lithography apparatus, an exposure apparatus that exposes a substrate with ultraviolet light, vacuum ultraviolet light, or extreme ultraviolet light has been described above. A lithography apparatus, however, is not limited thereto, and can be any lithography apparatus including a movable stage (for example, at least one of an original stage and a substrate stage). For example, a lithography apparatus may be a lithography apparatus configured to perform drawing on a substrate (photosensitive material thereon) with a charged particle beam such as an electron beam, or an imprint device configured to form a pattern on a substrate by forming (molding) an imprint material on the substrate using a mold.

(Article Manufacturing Method)

An article manufacturing method according to an embodiment of the present invention is preferred in manufacturing an article such as a micro device such as a semiconductor device or the like, or an element or the like having a microstructure, or the like. The article manufacturing method may include a step of forming a pattern (e.g., latent image pattern) on an object (e.g., substrate on which a photosensitive material is coated) using the aforementioned lithography apparatus; and a step of processing (e.g., step of developing) the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity, and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-239116 filed on Oct. 30, 2012, which is hereby incorporated by reference herein in its entirety.

What is claimed is:

1. A stage apparatus comprising:
   a base;
   a movable portion including a stage movable relative to the base;
   a flexible utility line for supplying utility to the movable portion; and
   a cover for covering the utility line, the cover including:
      a housing member provided to one of the base and the movable portion, an opening being formed in the housing member and defining a space sized so that the housing member does not come in contact with a bending portion of the flexible utility line when the bending portion of the flexible utility line moves; and
      a sealing member provided to the other of the base and the movable portion, the sealing member being arranged opposite to a side, in which the opening is formed, of the housing member with a gap therebetween, the sealing member moving relative to the side due to movement of the movable portion and having a side for sealing the opening.

2. The stage apparatus according to claim 1, wherein each of the housing member and the sealing member includes a connector to which the utility line is connected.

3. The stage apparatus according to claim 1, wherein each of the housing member and the sealing member includes a connector to which the utility line is connected outside the cover.

4. A lithography apparatus for forming a pattern on a substrate, the apparatus comprising:
   a stage apparatus, the stage apparatus including:
   a base;
   a movable portion including a stage movable relative to the base;
   a flexible utility line for supplying utility to the movable portion; and
   a cover for covering the utility line, the cover including:
      a housing member provided to one of the base and the movable portion, an opening being formed in the housing member and defining a space sized so that the housing member does not come in contact with a bending portion of the flexible utility line when the bending portion of the flexible utility line moves; and
      a sealing member provided to the other of the base and the movable portion, the sealing member being arranged opposite to a side, in which the opening is formed, of the housing member with a gap therebetween, the sealing member moving relative to the side due to movement of the movable portion and having a side for sealing the opening.

5. A method of manufacturing an article, the method comprising:
   forming a pattern on a substrate using a lithography apparatus; and
   processing the substrate, on which the pattern has been formed, to manufacture the article,
   wherein the lithography apparatus includes a stage apparatus, the stage apparatus including:
   a base;
   a movable portion including a stage movable relative to the base;
   a flexible utility line for supplying utility to the movable portion; and
   a cover for covering the utility line, the cover including:
      a housing member provided to one of the base and the movable portion, an opening being formed in the housing member and defining a space sized so that the housing member does not come in contact with a bending portion of the flexible utility line when the bending portion of the flexible utility line moves; and
      a sealing member provided to the other of the base and the movable portion, the sealing member being arranged opposite to a side, in which the opening is formed, of the housing member with a gap therebetween, the sealing member moving relative to the side due to movement of the movable portion and having a side for sealing the opening.

6. The stage apparatus according to claim 1, wherein the side of the housing member and the side of the sealing member are arranged in parallel to a moving direction of the movable portion.

7. The stage apparatus according to claim 1, wherein the housing member includes a box-shaped cover and the sealing member includes a plate-shaped cover.

8. A stage apparatus comprising:
   a base;
   a movable portion including a stage movable relative to the base;
   a flexible utility line for supplying utility to the movable portion; and
   a cover for covering the utility line, the cover including:
      a first cover member provided to one of the base and the movable portion, an opening being formed in the first cover member and defining a space sized so that the first cover member does not come in contact with a bending portion of the flexible utility line when the bending portion of the flexible utility line moves; and
      a second cover member provided to the other of the base and the movable portion, the second cover member being arranged opposite to a side, in which the opening is formed, of the first cover member with a gap therebetween, the second cover member moving relative to the side due to movement of the movable portion and having a side for covering the opening.

9. A lithography apparatus for forming a pattern on a substrate, the apparatus comprising:
   a stage apparatus, the stage apparatus including:
   a base;
   a movable portion including a stage movable relative to the base;
   a flexible utility line for supplying utility to the movable portion; and
   a cover for covering the utility line, the cover including:
      a first cover member provided to one of the base and the movable portion, an opening being formed in the first cover member and defining a space sized so that the first cover member does not come in contact with a bending portion of the flexible utility line when the bending portion of the flexible utility line moves; and
      a second cover member provided to the other of the base and the movable portion, the second cover member being arranged opposite to a side, in which the opening is formed, of the first cover member with a gap therebetween, the second cover member moving relative to the side due to movement of the movable portion and having a side for covering the opening.

10. A method of manufacturing an article, the method comprising:
   forming a pattern on a substrate using a lithography apparatus; and
   processing the substrate, on which the pattern has been formed, to manufacture the article,
   wherein the lithography apparatus includes a stage apparatus, the stage apparatus including:

a base;
a movable portion including a stage movable relative to the base;
a flexible utility line for supplying utility to the movable portion; and
a cover for covering the utility line, the cover including:
- a first cover member provided to one of the base and the movable portion, an opening being formed in the first cover member and defining a space sized so that the first cover member does not come in contact with a bending portion of the flexible utility line when the bending portion of the flexible utility line moves; and
- a second cover member provided to the other of the base and the movable portion, the second cover member being arranged opposite to a side, in which the opening is formed, of the first cover member with a gap therebetween, the second cover member moving relative to the side due to movement of the movable portion and having a side for covering the opening.

* * * * *